(12) United States Patent
Akamatsu

(10) Patent No.: US 6,236,251 B1
(45) Date of Patent: May 22, 2001

(54) SEMICONDUCTOR INTEGRATED CIRCUIT WITH MULTIPLE SELECTIVELY ACTIVATED SYNCHRONIZATION CIRCUITS

(75) Inventor: Hironori Akamatsu, Hirakata (JP)

(73) Assignee: Matsushita Electric Industrial Co., Ltd., Kodoma (JP)

( * ) Notice: Subject to any disclaimer, the term of this patent is extended or adjusted under 35 U.S.C. 154(b) by 0 days.

(21) Appl. No.: 09/261,685

(22) Filed: Mar. 3, 1999

(30) Foreign Application Priority Data

Mar. 4, 1998 (JP) .................................................. 10-052365

(51) Int. Cl.$^7$ ...................................................... H03L 7/00
(52) U.S. Cl. .............................................. 327/144; 327/155
(58) Field of Search .................................... 327/141, 144, 327/154, 161, 162, 163, 145, 152

(56) References Cited

U.S. PATENT DOCUMENTS

| | | | |
|---|---|---|---|
| 5,043,596 | * 8/1991 | Masuda et al. ...................... | 327/297 |
| 5,317,601 | * 5/1994 | Riordan et al. ...................... | 375/107 |
| 5,389,826 | * 2/1995 | Sonobe .................................. | 327/125 |
| 5,955,905 | * 9/1999 | Idei et al. ............................. | 327/160 |

OTHER PUBLICATIONS

T. Saeke et al.; IEEE Journal of Solid–State Circuits, vol. 31, No. 11, pp. 1656–1665, 1996, "A 2.5–ns Clock Access, 250–MHZ, 256–Mb, SDRAM with Synchronous Mirror Delay".

* cited by examiner

Primary Examiner—Kenneth B. Wells
Assistant Examiner—Hai L. Nguyen
(74) Attorney, Agent, or Firm—Renner, Otto, Boisselle & Sklar

(57) ABSTRACT

A semiconductor integrated circuit provided on a semiconductor chip includes a first synchronization circuit for receiving an external clock signal supplied from outside the semiconductor chip and outputting a first internal clock signal synchronized with the external clock signal and usable inside the semiconductor chip; a second synchronization circuit for receiving the first internal clock signal and outputting a second internal clock signal synchronized with the first internal clock signal and usable inside the semiconductor chip; and a functional block operable in synchronization with the second internal clock signal.

5 Claims, 8 Drawing Sheets

SEMICONDUCTOR INTEGRATED CIRCUIT WITH MULTIPLE SELECTIVELY ACTIVATED SYNCHRONIZATION CIRCUITS

BACKGROUND OF THE INVENTION

1. Field of the Invention

The present invention relates to a semiconductor integrated circuit provided on a semiconductor chip, and in particular, to a semiconductor integrated circuit operable in synchronization with an external clock signal supplied from outside the semiconductor chip.

2. Description of the Related Art

Conventionally, in a structure in which a semiconductor integrated circuit formed on a semiconductor chip operates in synchronization with an external clock signal supplied from outside the semiconductor chip, a synchronization circuit such as a PLL (Phase-Locked Loop) circuit is used for outputting an internal clock signal in synchronization with the external clock signal. The internal clock signal output by the synchronization circuit is supplied to a plurality of functional blocks formed on the semiconductor chip.

However, it is difficult to completely uniformalize the distances between the synchronization circuit and each of the plurality of functional blocks due to various constrains in laying out the synchronization circuit and the plurality of functional blocks on the semiconductor chip. In the case where the distances between the synchronization circuit and each of the plurality of functional blocks are different from one another, the transfer delays of the internal clocks to the functional blocks vary. Such differences generate a skew of the internal clock signal. The higher the frequency of the external clock signal is, the more serious the skew is.

SUMMARY OF THE INVENTION

A semiconductor Integrated circuit provided on a semiconductor chip according to the present invention includes a first synchronization circuit for receiving an external clock signal supplied from outside the semiconductor chip and outputting a first internal clock signal synchronized with the external clock signal and usable inside the semiconductor chip; a second synchronization circuit for receiving the first internal clock signal and outputting a second internal clock signal synchronized with the first internal clock signal and usable inside the semiconductor chip; and a functional block operable in synchronization with the second internal clock signal.

In one embodiment of the invention, the first synchronization circuit has a first setup time period from when an operation start is requested until the first synchronization circuit starts a synchronization operation, the second synchronization circuit has a second setup time period from when an operation start is requested until the second synchronization circuit starts a synchronization operation, and the second setup time period is shorter than the first setup time period.

In one embodiment of the invention, the first synchronization circuit has a function of adjusting a duty ratio of the first internal clock signal.

In one embodiment of the invention, the second synchronization circuit is a mirror delay-type DLL (Delayed-Locked Loop) circuit including a circuit for advancing a phase of the second Internal clock signal.

In one embodiment of the invention, the semiconductor integrated circuit further includes at least one other second synchronization circuit so as to include a plurality of second synchronization circuits; at least one other functional block so as to include a plurality of functional blocks; and a selection circuit for selecting at least one of the plurality of functional blocks in accordance with a functional block selection signal. The plurality of second synchronization circuits each receive the first internal clock signal and output a second internal clock signal synchronized with the first internal clock is signal and usable inside the semiconductor chip. The plurality of functional blocks are each operable in synchronization with the second internal clock signal which is output from one second synchronization circuit, among the plurality of second synchronization circuits, which corresponds to each of the functional blocks. The plurality of second synchronization circuits are selectively activated in accordance with the functional block selection signal.

In one embodiment of the invention, the plurality of functional blocks include memory cell array blocks each including a row-system circuit for receiving a row address and a column-system circuit for receiving a column address. The row-system circuit is operable in response to the functional block selection signal. The column-system circuit is operable in response to the second internal clock signal.

According to the present invention, a first internal clock signal synchronized with an external clock signal is output by a first synchronization circuit, and a second internal clock signal synchronized with the first internal clock signal is output by a second synchronization circuit. The second internal clock signal is supplied to a functional block. The second synchronization circuit can be located at any position on a semiconductor chip. By locating the second synchronization circuit in the vicinity of the functional block, generation of a skew of the second internal clock signal is avoided regardless of the position of the functional block on the semiconductor chip.

In one embodiment a first synchronization circuit having a first setup time period and a second synchronization circuit having a second setup time period which is shorter than the first setup time period can be used. In the case where a synchronization circuit having a relatively long setup time (e.g., a PLL circuit) and a synchronization circuit having a relatively short setup time (e. g. a mirror delay-type DLL circuit) are combined, the semiconductor integrated circuit operates at a higher speed than in the case where the same type of synchronization circuits having a relatively long setup time period are combined.

In another embodiment, the duty ratio of the first internal clock signal can be adjusted to an appropriate value (typically, 1:1) by the first synchronization circuit. Once the duty ratio of the first internal clock signal is adjusted to be an appropriate value in the semiconductor chip, the probability, that the duty ratio of the second internal clock signal based an the first internal clock signal changes in the semiconductor chip can be ignored in practice. Accordingly, adjustment of the duty ratio of the second internal clock signal can be omitted by adjusting the duty ratio of the first internal clock signal. This allows a synchronization circuit which does not have a function of adjusting the duty ratio of the second internal clock signal to be used as the second synchronization circuit.

In still another embodiment, the phase of the second internal clock signal can be advanced by the mirror delay-type DLL circuit. Thus, the phase of the second internal clock signal at a specified position on the semiconductor chip supplied with the second internal clock signal and the phase of the first internal clock signal input to the second synchronization circuit can be matched to each other.

In still another embodiment, a plurality of second synchronization circuits are selectively activated in accordance with a functional block selection signal. Thus, the number of second synchronization circuits in an active state can be minimized. As a result, an increase in the power consumption of the semiconductor integrated circuit can be prevented.

In still another embodiment, a semiconductor integrated circuit which includes a memory cell array block and prevents an increase in the power consumption can be provided.

Thus, the invention described herein makes possible the advantages of providing (1) a semiconductor integrated circuit for allowing an internal clock signal synchronized with an external clock signal to be supplied to functional blocks arranged on arbitrary positions on the semiconductor chip without generating a skew of the internal clock signal; (2) a semiconductor integrated circuit operable at a high speed in synchronization with an external clock signal; and (3) a semiconductor integrated circuit operable at a low power consumption in synchronization with an external clock signal.

This and other advantages of the present invention will become apparent to those skilled in the art upon reading and understanding the following detailed description with reference to the accompanying figures.

DESCRIPTION OF THE EMBODIMENTS

Hereinafter, the present invention will be described by way of illustrative examples with reference to the accompanying drawings.

Figure 1:
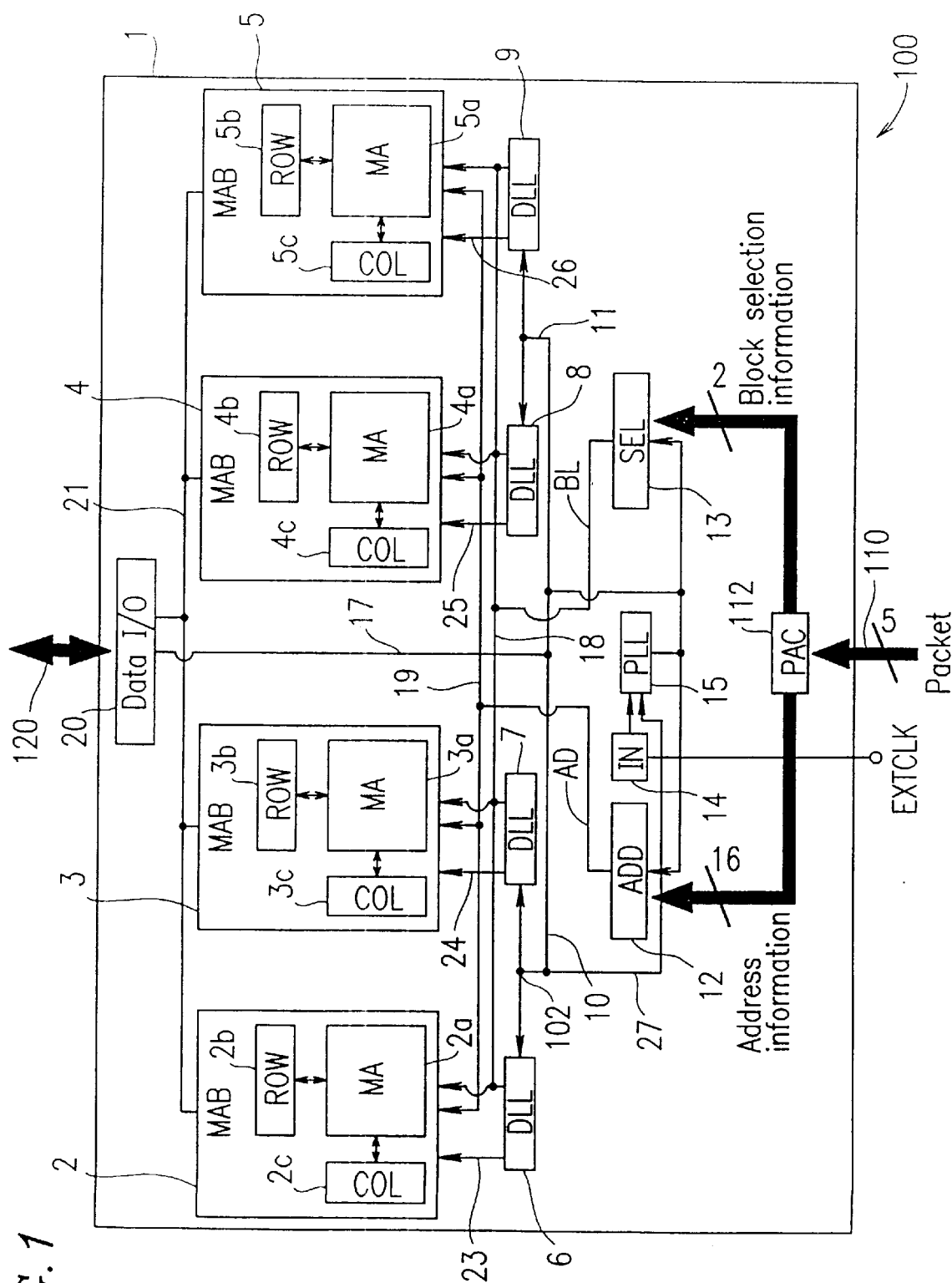
FIG. 1 is a block diagram illustrating a structure of a semiconductor integrated circuit in one example according to the present invention.

FIG. 1 is a block diagram illustrating a structure of a semiconductor integrated circuit 100 in one example of the present invention. The semiconductor integrated circuit 100 is provided on a semiconductor chip 1.

The integrated circuit 100 operates in synchronization with an external clock signal EXTCLK supplied from outside the semiconductor chip 1. The external clock signal EXTCLK is, for example, a system clock signal. The external clock signal EXTCLK is input to a PLL circuit 15 via an external clock signal input section (IN) 14.

The PLL circuit 15 receives the external clock signal EXTCLK and outputs a first internal clock signal INTCLK1 synchronized with the external clock signal EXTCLK. The first internal clock signal INTCLK1 is used inside the semiconductor chip 1.

The first internal clock signal INTCLK1 output from the PLL circuit 15 is supplied to DLL (Delayed-Locked Loop) circuits 6 and 7 via an Internal clock signal line 10 and In also supplied to DLL circuits 8 and 9 via an internal clock signal line 11. The internal clock signal INTCLK1 is input to the PLL circuit 15 via a feedback line 27.

The internal clock signal INTCLK1 input to the PLL circuit 15 via the feedback line 27 is used for synchronization with the external clock signal EXTCLK. Thus, the frequency and phase of the internal clock signal INTCLK1 at an arbitrary point on the internal clock signal line 10 for transferring the first Internal clock signal INTCLK1 (for example, a point 102 In the vicinity of the DLL circuits 6 and 7) is allowed to be synchronized with the frequency and phase of the external clock signal EXTCLK.

The DLL circuits 6 through 9 each receive the first internal clock signal INTCLK1 and output a second internal clock signal INTCLK2 synchronized with the first internal clock signal INTCLK1. The second internal clock signal INCLK2 to used inside the semiconductor chip 1.

The second internal clock signal INCLK2 output from the DLL circuit 6 is supplied to a memory cell array block (MAB) 2 via an internal clock signal line 23. The second internal clock signal INTCLK2 output from the DLL circuit 7 is supplied to a memory cell array block (MAB) 3 via an internal clock signal line 24 The second internal clock signal INTCLK2 output from the DLL circuit a is supplied to a memory cell array block (MAB) 4 via an internal clock signal line 25. The second internal clock signal INTCLK2 output from the DLL circuit 9 is supplied to a memory cell array block (MAB) 5 via an internal clock signal line 26.

The memory call array blocks 2 through 5 operate in synchronization with the second internal clock signal INTCLK2.

The memory cell array block 2 includes a memory cell array (MA) 2a including a plurality of memory cells, a row-system circuit (ROW) 2b operating in response to a row address, and a column-system circuit (COL) 2c operating in response to a column address. Although not shown, the row-system circuit 2b includes a row address decoder, a word line driving circuit, and a sensing amplifier. Although not shown, the column-system circuit 2c includes a column address decoder, a column selection circuit, and a data router circuit. A memory cell, among the plurality of memory calls included in the memory cell array 2a, which is determined by the row-system circuit 2b and the column-system circuit 2c, it accessed.

The memory cell array blocks 3 through 5 each have similar structures as that of the memory cell array block 2.

As described above, in the semiconductor integrated circuit 100, the first internal clock signal INTCLK1 synchronized with the external clock signal EXTCLK is output by the PLL circuit 15, and the second internal clock signal INTCLK2 synchronized with the first internal clock signal INTCLK1 is output by each of the DLL circuits 6 through 9. The second internal clock signal INTCLK2 output by each of the DLL circuits 6 through 9 is supplied to each of the memory cell array blocks 2 through 5. The DLL circuits 6 through 9 each can be located at an arbitrary position on the semiconductor chip 1. By locating the DLL circuits 6 through 9 respectively in the vicinity of the memory cell array blocks 2 through 5 generation of a skew of the second internal clock signal INTCLK2 in prevented regardless of the positions of the memory cell array blocks 2 through 5.

The first internal clock signal INTCLK1 output by the PLL circuit 15 is supplied to a data input/output (DATA I/O) section 20 via an internal clock signal line 17. The data input/output section 20 operates in synchronization with the first internal clock signal INTCLK1.

The data input/output section 20 is used for outputting data which to read from any one of the memory cell array blocks 2 through 5 to an external data bus 120 via an internal data signal line 21 and for inputting data from the external data bus 120 to any one of the memory cell array blocks 2 through 5 via the internal data signal line 21.

The first internal cloak signal INTCLK1 is further supplied to an address information input section (ADD) 12 and to a block selection information input section (SEL) 13. The address information input section 12 and the block selection information input section 13 operate in synchronization with the first internal clock signal INTCLK1.

The address information input section 12 takes in address information from a packet input circuit (PAC) 112 in response to the first internal clock signal INTCLK1. The address information is, for example, 16-bit data. The address Information input section 12 outputs an address AD based on the address information. The address AD is supplied to the memory cell array blocks 2 through 5 via an address bus 19. The address AD includes a raw address and a column address.

The block selection information input section 13 takes In block selection information from the packet input circuit 112 in response to the first Internal clock signal INTCLK1. The block selection information is, for example, 2-bit data. The block selection information input section 13 outputs a block selection signal BL based on the block selection information. The block selection signal BL Is supplied to the memory cell array blocks 2 through 5 and the DLL circuits 6 through 9 via the block selection signal line 18.

The packet input circuit 112 receives a prescribed number of packets (for example, four packets) from an external bus 110 and analyses the contents of the prescribed number of packets. As a result, the packet input circuit 112 provides address information to the address information input section 12 and block selection information to the block selection information input section 13. The external bus 110 is, for example, a 5-bit bus. By inputting information to the semiconductor chip 1 using a prescribed number of packets in this manners the bit width of the external bus 110 can be reduced.

Table 1 shows the relationship between the block selection information and the memory cell array block selected by the block selection signal BL. In the example shown in Table 1, the block selection information is 2-bit data. In Table 1, the 0th bit of the block selection information is represented as "B0" and the 1st bit of the block selection information is represented as "B1".

TABLE 1

| Block | B0 | 0 | 0 | 1 | 1 |
| selection | B1 | 0 | 1 | 0 | 1 |
| information | | | | | |

TABLE 1-continued

| Selection by block selection signal BL | Memory cell array block 2 | Memory cell array block 3 | Memory cell array block 4 | Memory cell array block 5 |
|---|---|---|---|---|

For example, when block selection information (B0, B1)=(0, 0), the memory call array block 2 is selected by the block selection signal BL. In this manner, one of the memory cell array blocks 2 through 5 is selected in accordance with the values of the block selection information (B0, B1).

In accordance with the values of the block selection information (B0, B1), one of the DLL circuits 6 through 9, which corresponds to the selected memory cell array block, is activated.

For example, when the memory cell array block 2 is selected by the block selection signal BL, the DLL circuit 6, which corresponds to the memory cell array block 2, is activated. The activated DLL circuit 6 starts operating. Thus, the DLL circuit 6 starts operating in accordance with a level change in the block selection signal BL. As a result, the DLL circuit 6 generates the second internal clock signal INTCLK2 synchronized with the first internal clock signal INTCLK1 and starts outputting the second internal clock signal INTCLK2. The DLL circuits 7 through 9 corresponding to the memory cell array blocks 3 through 5 which are not selected by the block selection signal BL are not activated. That is, the DLL circuits 7 through 9 are in a pause state. Accordingly, the second internal clock signal INTCLK2 is not output from the DLL circuits 7 through 9.

As described above, the DLL circuits 6 through 9 are activated in accordance with the block selection signal EL. In other words, the DLL circuit corresponding to the memory cell array block selected by the block selection signal BL (i.e., memory call array block in an operation state) is activated and the DLL circuits corresponding to the other memory call array blocks (i.e., memory cell array blocks in a wait state) are not activated Due to such a system, the number of DLL circuits in an activated state is minimized. As a result an increase in the power consumption of the semiconductor integrated circuit 100 can be prevented.

Where a setup time period required for setting up the PLL circuit 15 (i.e., the time period from when an operation start is requested until the PLL circuit 15 actually starts a synchronization operation) is $T_{S1}$, and a setup time period required for setting up the DLL circuits 6 through 9 (i.e., the time period from when an operation start in requested until the DLL circuits 6 through 9 actually start a synchronization operation) is $T_{S2}$, $T_{S2}<T_{S1}$. That is, the setup time period of the DLL circuits 6 through 9 is shorter than the setup time period of the PLL circuit 15. For example the setup time period of the PLL circuit 15 is several hundred clock cycles whereas the setup time period of mirror delay-type DLL circuits (described later with reference to FIG. 4) is only 2 clock cycles.

In the case where a synchronization circuit having a relatively long setup time period (e.g., the PLL circuit) and a synchronization circuit having a relatively short setup time period (e.g.. mirror delay-type DLL circuit) are combined, the semiconductor integrated circuit 100 operates at a higher speed than in the case where the same type of synchronization circuits having a relatively long setup time period are combined.

Combining the same type of synchronization circuits having a relatively short setup time is advantageous for operating the semiconductor integrated circuit 100 at a high speed, but a synchronization circuit having a relatively short setup time (e.g., mirror delay-type DLL circuit) has a disadvantage of not having a function of adjusting the duty ratio of the internal clock signal at the present art level. A synchronization circuit preferably has a function of adjusting the duty ratio since the duty ratio of the internal clock signal is preferably 1:1. Accordingly, at the present art level, it is optimum to combine a synchronization circuit having a relatively long setup time period but having a function of adjusting the duty ratio of the internal clock signal and a synchronization circuit having a relatively short setup time period.

The PLL circuit 15 has a function of adjusting the duty ratio of the first internal clock signal INTCLK1 (i.e., the ratio of the period during which the first internal clock signal INTCLK1 is at a HIGH level with respect to the period during which the signal INTCLK1 is at a LOW level). The PLL circuit 15 adjusts the duty ratio of the first internal clock signal INTCLK1 to an appropriate value (typically, 1:1).

Once the duty ratio of the first internal clock signal INTCLK1 is adjusted to an appropriate value in the semiconductor chip 1, the probability that the duty ratio of the second internal clock signal INTCLK2 based on the first internal clock signal INTCLK1 changes in the semiconductor chip 1 can be ignored in practice. Accordingly, adjustment of the duty ratio of the second internal clock signal INTCLK2 can be omitted by adjusting the duty ratio of the first internal clock signal INTCLK1 by the PLL circuit 15. This permits the use of DLL circuit having no function of adjusting the duty ratio of the second internal clock signal INTCLK2 as the DLL circuits 6 through 9.

For example, a mirror delay-type DLL circuit does not have a function of adjusting the duty ratio of the second Internal clock signal INTCLK2, unlike the PLL circuit 15. One advantage of the mirror delay-type DLL circuit is that it has a very short setup time period, which can be utilized by using such a mirror delay-type DLL circuit as each of the DLL circuits 6 through 9 in combination with the PLL circuit 15.

Figure 4:
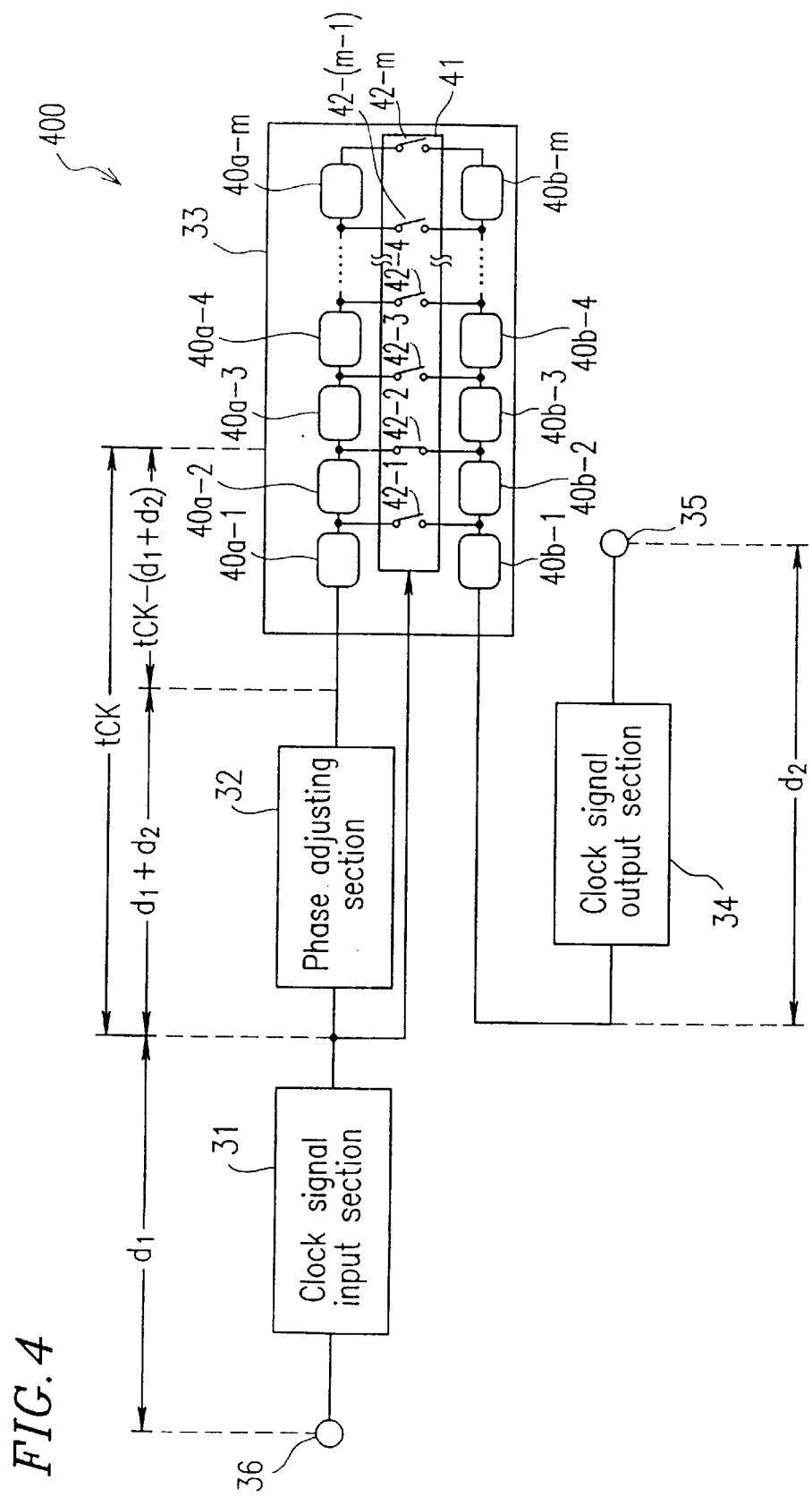
FIG. 4 is a block diagram illustrating a structure of a mirror delay-type DLL circuit usable in the semiconductor Integrated circuit shown in FIG. 1.

When, for example, the mirror delay-type DLL circuit described later with reference to FIG. 4 is used, the second internal clock signal INTCLK2 is synchronized with the first internal clock signal INTCLK1 in 2 clock cycles after the DLL circuit starts operating in response to the block selection signal BL. Thus, the operation of the DLL circuit 6 through 9 can be started at a high speed by using the synchronization circuits having a relatively short setup time period as the DLL circuit 6 through 9.

Figure 2:
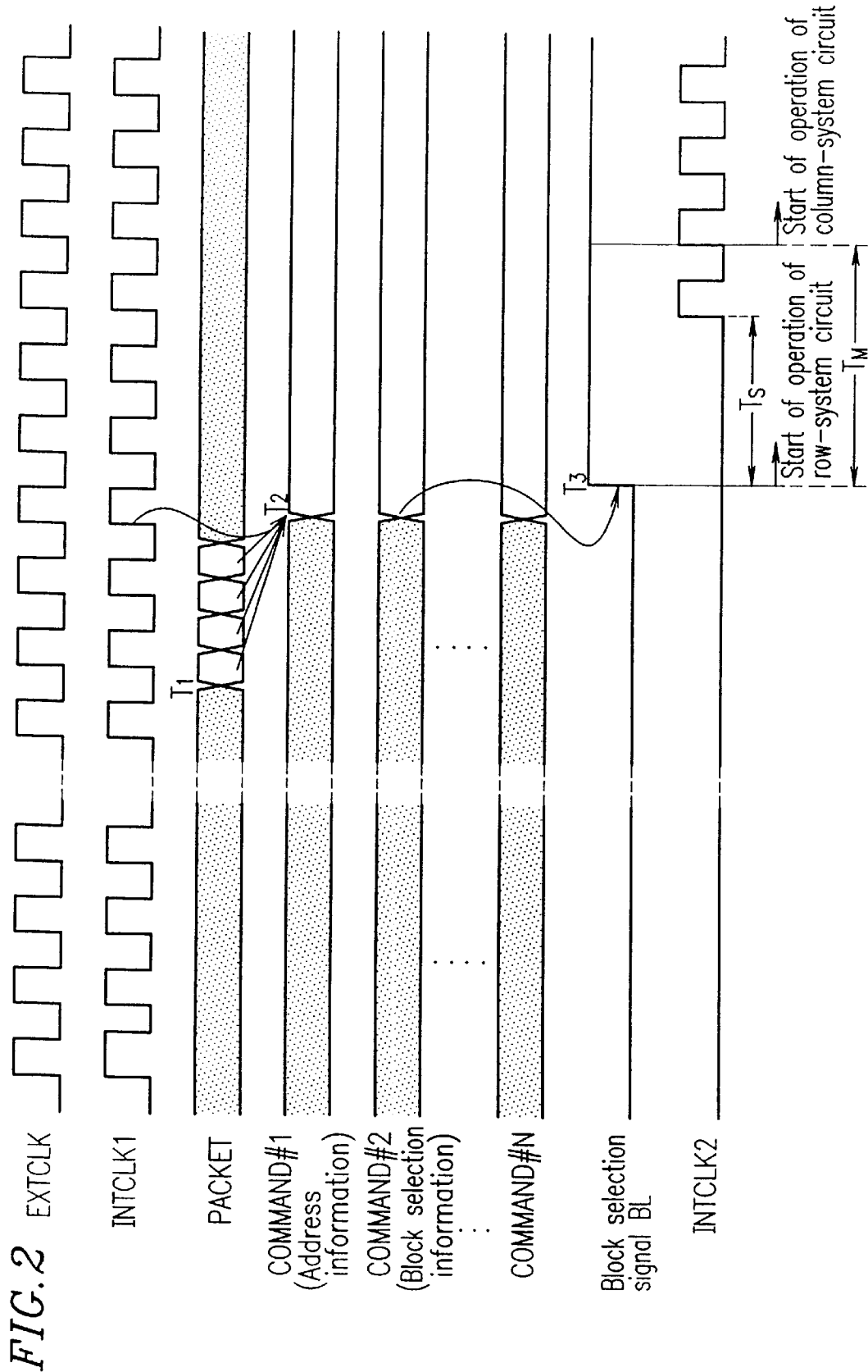
FIG. 2 is a timing diagram illustrating operation timing of the semiconductor integrated circuit shown in FIG. 1.

FIG. 2 is a timing diagram illustrating operation timing of the semiconductor integrated circuit 100. As described above, the first internal clock signal INTCLK1 is synchronized with the external clock signal EXTCLK by the PLL circuit 15.

Starting from time $T_1$, four packets PACKET are input to the packet input circuit 112 from the external bus 110 in synchronization with the external clock signal EXTCLK. The four packets PACKET include address information, block selection information, and other information (for example, information indicating read/write control)

At time $T_2$, the packet input circuit 112 generates N-piece commands COMMAND#1 through COMMAND#N based on the contents of the four packets PACKET. Herein, "N" indicates an integer of 1 or more. The commands COMMAND#1 through COMMAND#N are used for accessing the memory cell array blocks 2 through 5. For example, the command COMMAND#1 is address information, and the command COMMAND#2 is block selection information.

At time $T_3$, the level of the block selection signal BL is changed from LOW to HIGH. In response to the change, one of the memory cell array blocks 2 through 5 is selected, and one of the DLL circuits 6 through 9 corresponding to the selected memory cell array block is also selected. As a result, the row-system circuit included in the selected memory cell array block starts operating, and the selected DLL circuit starts operating.

In the case where the selected DLL circuit is a mirror delay-type circuit, the selected DLL circuit starts outputting the second internal clock signal INTCLK2, which is synchronized with the first internal clock signal INTCLK1, 2 clock cycles after time $T_3$.

The column-system circuit included in the selected memory cell array block starts operating after the selected DLL circuit starts outputting the second Internal clock signal INTCLK2.

As described above, in the selected memory cell array block, the row-system circuit starts operating and then the column-system circuit starts operating. The row system circuit starts operating in response to the block selection signal BL because the row-system circuit does not need to be synchronized with the high-speed clock signal. The column-system circuit, which needs to operate in synchronization with the second internal clock signal INTCLK2, starts operating after the selected DLL circuit starts outputting the second internal clock signal INTCLK2 synchronized with the first internal clock signal INTCLK1.

The selected DLL circuit starts operating in response to the block selection signal BL.

In order to operate the selected memory cell array block normally, the setup time period of the selected DLL circuit (represented as "$T_S$" in FIG. 2) needs to fulfill the condition of being shorter than an operation margin time period (represented as "$T_M$" in FIG. 2) of the selected memory cell array block. The setup time period of the selected DLL circuit refers to the time period required from when the selected circuit starts operating until when the second internal clock signal INTCLK2, synchronized with the first internal clock signal INTCLK1, is supplied to the selected memory array block. The operation margin time period refers to the time period required from when the row-system circuit starts operating until when the column-system circuit starts operating.

The row-system circuit requires a prescribed time period to complete the operation because the row-system circuit activates a memory cell connected to the row (word line), the address of which has been input. The column-system circuit activates the selected memory cell, and reads and writes data. Accordingly, the column-system circuit cannot start operating until the row-system circuit completes the operation.

As described above, in the case where a mirror delay-type circuit is used, time period $T_S$ is only 2 clock cycles. Therefore, the condition of time period $T_S$<time period $T_M$ is easily fulfilled. Thus, the selected memory cell array block operates normally.

As can be appreciated, when one of the memory cell array blocks 2 through 5 starts operating the address AD has already been input to the memory cell array block from the address information input section 12 via the address bus 19. Thus, the memory cell corresponding to the address AD can be accessed.

Figure 3:
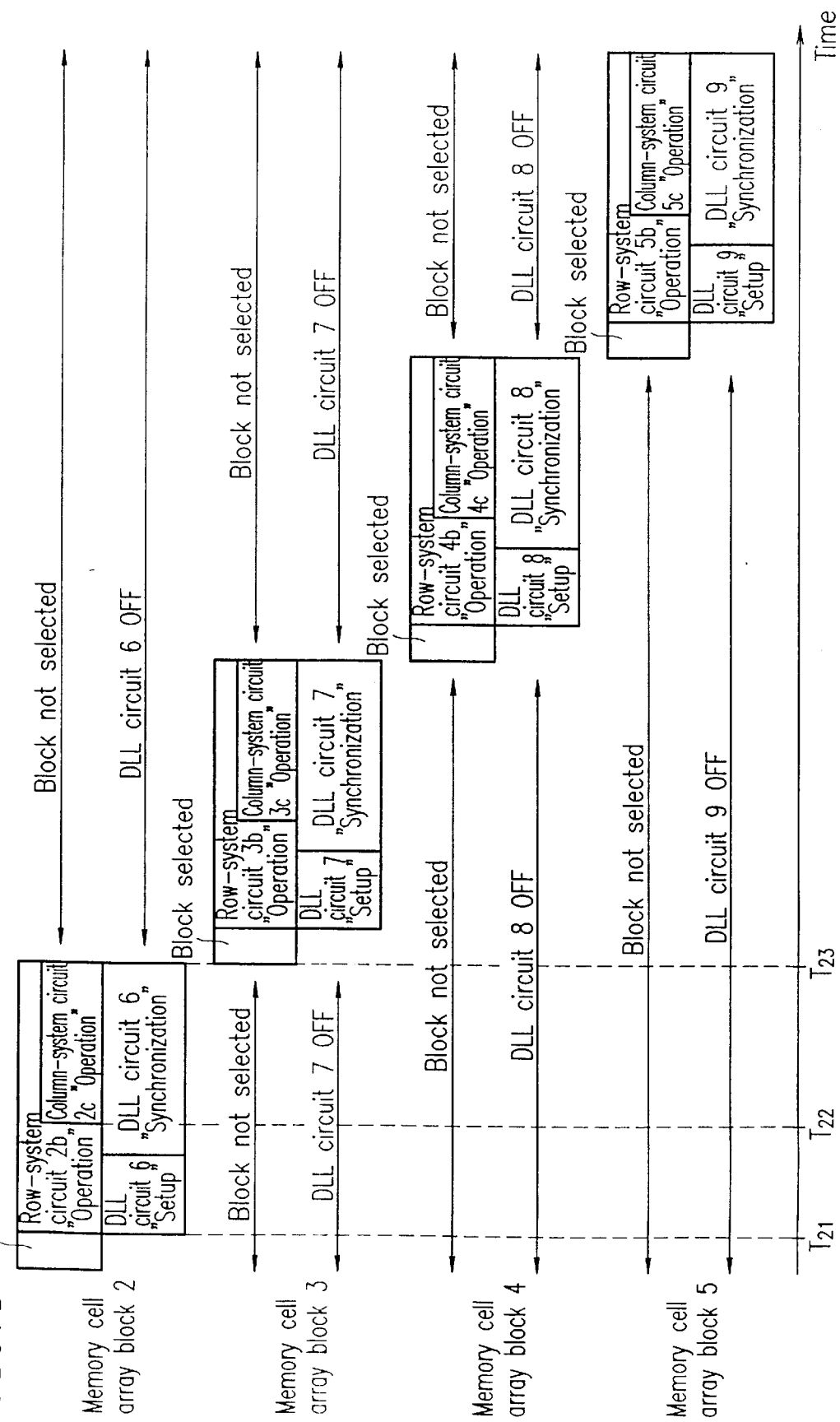
FIG. 3 is a timing diagram illustrating a change in operation states of memory cell array blocks in the semiconductor Integrated circuit shown in FIG. 12

FIG. 3 is a timing diagram illustrating a change in operation states of the memory call array blocks 2 through 5.

At time $T_{21}$, when the memory cell array block 2 and the DLL circuit 6 are selected by the block selection signal BL, the operation of the row-system circuit 2b in the memory cell array block 2 and the operation of the DLL circuit 6 (setup operation) are started.

At time $T_{22}$, the operation of the column-system circuit 2a in the memory cell array block 2 is started. At or before time $T_{22}$ (preferably, before time $T_{22}$), the output of the second internal clock signal INTCLK2 synchronized with the first internal clock signal INTCLK1 from the DLL circuit 6 is started.

At time $T_{23}$, the operation of the memory cell block array 2 and the operation of the DLL circuit 6 are terminated.

From time $T_{21}$ to time $T_{23}$, the memory cell array blocks 3 through 5 and the DLL circuit 7 through 9 do not operate.

Thereafter, another memory cell array block and the corresponding DLL circuit are selected by the block selection signal BL in a similar manner. The memory array blocks 2 through 5 are selected in an arbitrary order.

The number of the DLL circuits in the operation state can be minimized by operating only the selected DLL circuit among the DLL circuits 6 through 9 and putting the other DLL circuits into a pause state as described above. Such a manner of operation prevents wasted power consumption by the DLL circuits in a wait state. Consequently, the power consumption of the semiconductor integrated circuit 100 is significantly reduced. The effect of reducing the power consumption is especially remarkable when the setup time period of the DLL circuits 6 through 9 is relatively short because the operation time of the DLL circuits 6 through 9 can be significantly shortened.

FIG. 4 is a block diagram illustrating a structure of a mirror delay-type DLL circuit 400, which can be used as each of the DLL circuits 6 through 9.

Such a mirror delay-type DLL circuit is described in, for example, "A 2.5 ns Clock Access 250 MHz 256 Mb SDRAM with a Synchronous Mirror Delay, 1996 IEEE International Solid-State Circuits Conference, pp. 374–375".

The mirror delay-type DLL circuit 400 includes a clock signal input section 31, a phase adjusting section 32, a mirror delay section 33 and a clock signal output section 34.

The clock signal input section 31 is, for example, an input buffer. The clock signal output section 34 is, for example an output driver. Herein, the delay amount of the clock signal by the clock signal input section 31 is $d_1$, and the delay amount of the clock signal by the clock signal output section 34 is $d_2$.

A prescribed delay amount by the phase adjusting section 32 can be set to an appropriate value. Herein, the delay amount by the phase adjusting section 32 is set to be $(d_1+d_2)$, for example.

The mirror delay circuit 33 includes 2 m-piece unit delay elements 40a-1 through 40a-m and 40b-1 through 40b-m, and a delay setting circuit 41 for controlling the m-piece switching elements 42-1 through 42-m to be on or off in accordance with the output from the clock signal input section 31. Herein, "m" is an integer of 1 or more.

The delay setting circuit 41 turns on one of the switching elements 42-1 through 42-m so that the delay amount of the clock signal by one or more unit delay elements 40a-1 through 40a-m included in the mirror delay circuit 33 is $(tCK-(d_1+d_2))$ and turns off the other (m-1)-piece switching elements. Therein, "tCK" refers to 1 clock cycle of the clock signal.

For example, when the delay amount by the unit delay elements 4a-1 and 40a-2 equals $(tCK-(d_1+d_2))$, the delay setting circuit 41 turns on the switching element 42-2 and turns off the switching elements 42-1 and 42-3 through 42-m. In this case, the delay amount of the clock signal by the unit delay elements 40b-1 and 40b-2 also equals $(tCK-(d_1+d_2))$ because the clock signal is transferred in the mirror delay circuit 33 in the order of the unit delay element 40a-1, the unit delay element 40a-2, the switching element 42-2, the unit delay element 40b-2, and the unit delay element 40b-1.

The sum D of the delay amounts generated by the transfer of the clock signal from an input terminal 36 to an output terminal 35 is found by expression (1).

$$D \approx d1(d1+d2)+\{tCK-(d1+d2)\}+\{tCK-(d1+d2)\}+d2=2\cdot tCK \quad (1)$$

Expression (1) indicates that a clock signal delayed by 2 clock cycles with respect to the clock signal input to the input terminal 36 is output from the output terminal 35.

By the mirror delay-type DLL circuit 400, 2 clock cycles after a clock signal is input to the input terminal 36, a clock signal having the same phase an the input clock signal is output from the output terminal 35. The mirror delay-type DLL circuit 400 requires the shortest time period for synchronizing the input clock signal and the output clock signal (i.e., setup time period) among existing DLL circuits.

The mirror delay-type DLL circuit 400 does not have the function of adjusting the duty ratio of the cloak signal, but such a disadvantage can be compensated for when being combined with a synchronization circuit having such a function (e.g., the PLL circuit 15 shown in FIG. 1). For example, after the duty ratio of the first internal clock signal INTCLKR is adjusted to be an appropriate value by the PLL circuit 15, the adjusted first internal clock signal INTCLK1 can be input to the mirror delay-type DLL circuit 400. In this manner, an advantage of the mirror delay-type DLL circuit 400 of a very short setup time period can be utilized.

The use of the mirror delay-type DLL circuit 400 allows the second Internal clock signal INTCLK2 synchronized with the first internal clock signal INTCLK1 to be supplied to each of the memory cell array blocks 2 through 5.

In a practical design, the delay amount by the phase adjusting section 32 is set to be $(d_1+d_2-\alpha)$ instead of $(d_1+d_2)$. This means that the phase of the clock signal output from the mirror delay-type DLL circuit 400 by a period corresponding to a delay amount CL. The delay amount $\alpha$ is determined by the transfer delay from the mirror delay-type DLL circuit 400 to the memory call array block. Thus, the phase of the first internal clock signal INTCLK1 input to the mirror delay-type DLL circuit 400 and the phase of the second internal clock signal INTCLK2 supplied to the memory cell array block are allowed to match each other.

Alternatively, the phase of the clock signal output by the mirror delay-type DLL circuit 400 can be advanced by the mirror delay circuit 33.

Figure 5:
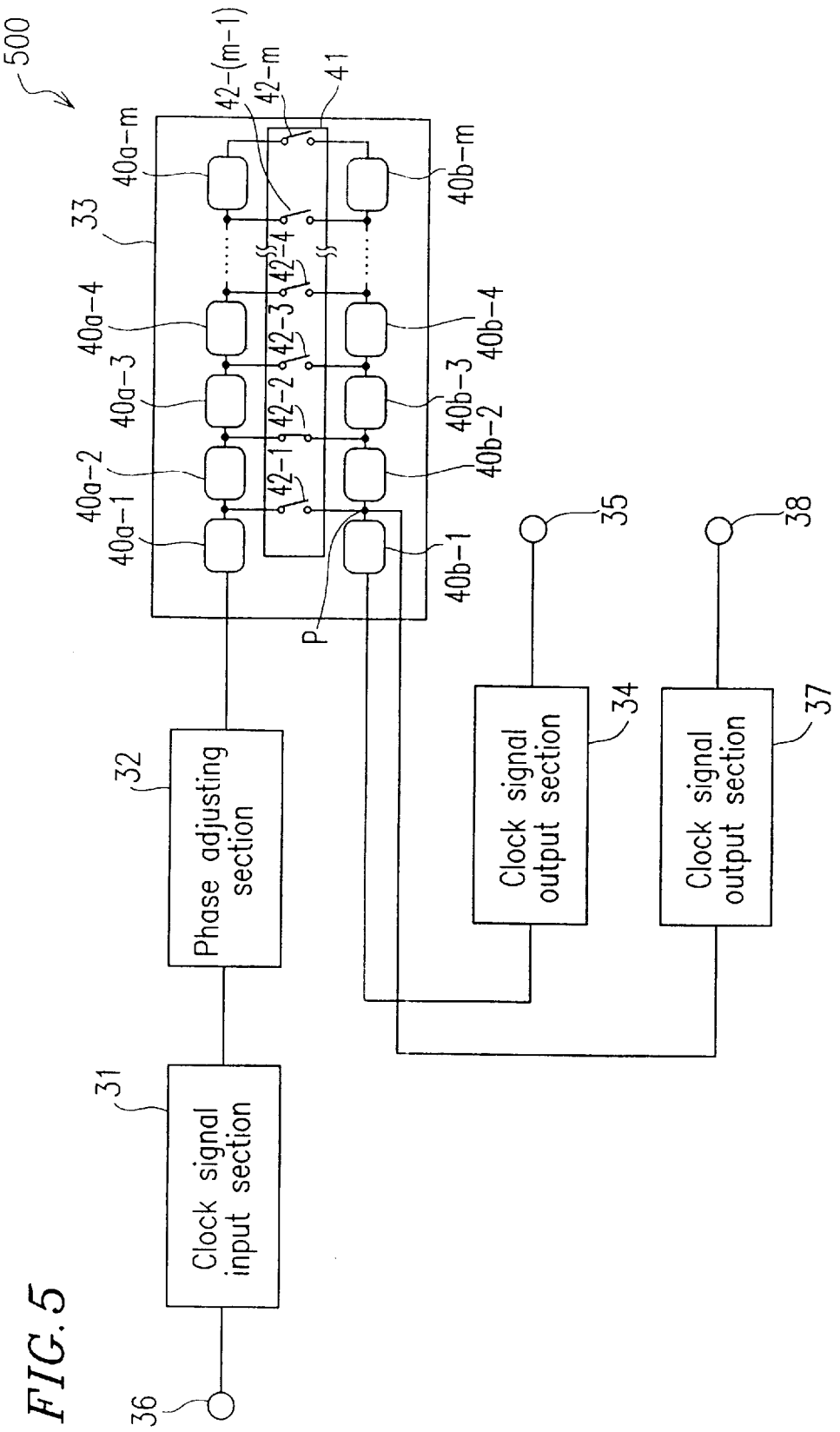
FIG. 5 is a block diagram illustrating another structure of a mirror delay-type DLL circuit usable in the semiconductor integrated circuit shown in FIG. 1.

FIG. 5 is a block diagram illustrating another structure of a mirror delay-type DLL circuit 500 which can be used as each of the DLL circuits 6 through 9 shown in FIG. 1. In FIG. 5. identical elements an those described with reference to FIG. 4 bear identical reference numerals therewith, and detailed descriptions thereof will be omitted.

The mirror delay-type DLL circuit 500 is structured so as to output a clock signal from a connection point P between the unit delay elements 40b-1 and 40b-2. The clock signal output from the connection point P is then output from an output terminal 38 via a clock signal output section 37. The clock signal output section 37 is, for example, an output driver. The delay amount of the clock signal by the clock signal output section 37 is assumed to be $d_2$ as the delay amount by the clock signal output section 34.

Comparing the clock signal output from the output terminal 35 and the cloak signal output from the output terminal 38, the phase of the latter is advanced with respect to the former by a period corresponding to the delay amount by the unit delay element 40b-1. This occurs because the former passes through the unit delay element 40b-1, whereas the latter does not pass through the unit delay element 40b-1.

By adjusting the position of the connection point P in the mirror delay circuit 33, the advancing amount of the clock signal output from the output terminal 38 can be adjusted. Herein, the position of the connection point P determined in consideration of the transfer delay from the mirror delay-type DLL circuit 500 to the memory cell array block prior to the operation of the semiconductor integrated circuit 100.

By supplying the clock signal output from the output terminal 38 to the memory array block as the second internal clock signal INTCLK2, the phase of the first internal clock signal INTCLK1 input to the mirror delay-type DLL circuit 500 and the phase of the'second internal clock signal INTCLK2 supplied to the memory array block are allowed to match each other.

Alternatively, the clock signal output from the output terminal 35 and the clock signal output from the output terminal 38 can both be supplied to the memory cell array block. In this case, a circuit among a plurality of circuits included in the memory cell array block which is located in the vicinity of the mirror delay-type DLL circuit can operate in synchronization with the clock signal output from the output terminal 35, and a circuit among a plurality of circuits Included in the memory cell array block which is located far from the mirror delay-type DLL circuit can operate in synchronization with the clock signal output from the output terminal 38. Such a control increases an operation margin of each of the circuits included in the memory call array block. As a result, data can be transferred at a higher speed.

In another alternative data can be read from the memory call array block in synchronization with the clock signal output from the output terminal 38, and the data can be transferred to the data input/output section 20 (FIG. 1) from the memory cell array block in synchronization with the clock signal output from the output terminal 35. Such an operation increases an operation margin of each of the circuits included in the semiconductor integrated circuit 100. As a result, data can be transferred at a higher speed.

Table 2 shows a combination of a first synchronization circuit and a second synchronization circuit, to which the present invention is applicable. Herein, the first synchronization circuit refers to a synchronization circuit for outputting the first internal clock signal INTCLK1 synchronized with the external clock signal EXTCLK, and the second synchronization circuit refers to a synchronization circuit for outputting the second internal clock signal INTCLK2 synchronized with the first internal clock signal INTCLK1.

TABLE 2

| Combination Number | First synchronization circuit | Second synchronization circuit |
| --- | --- | --- |
| 1 | PLL | PLL |
| 2 | PLL | DLL |
| 3 | PLL | MD-DLL |
| 4 | DLL | DLL |
| 5 | DLL | MD-DLL |
| 6 | DLL | MD-DLL |

In Table 2, "PLL" refers to a PLL circuit, "DLL" refers to a DLL circuit, and "MD-DLL" refers to a mirror delay-type DLL circuit.

Figure 6A:
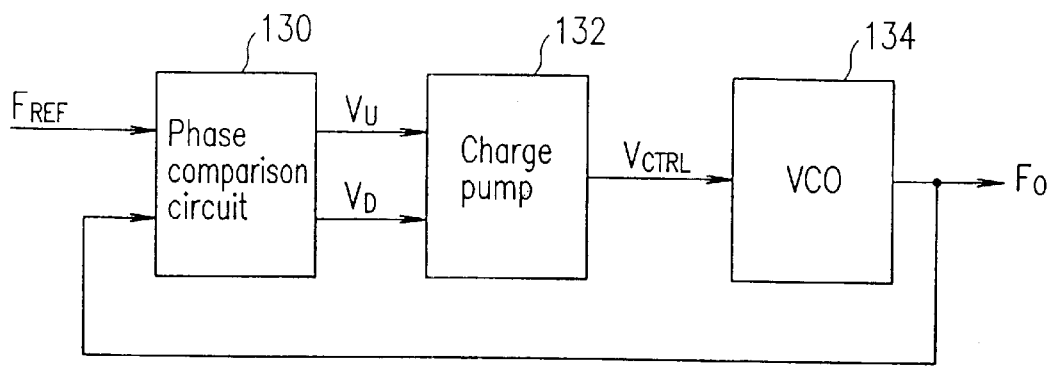
FIG. 6A is a block diagram illustrating a representative configuration of a PLL circuit.

The PLL circuit represented as "PLL" in Table 2 outputs a clock signal synchronized with a reference clock signal by changing the frequency of an oscillation circuit in accordance with a comparison result between the phase of the reference clock signal and the phase of the clock signal output from the oscillation circuit. FIG. 6A shows a representative configuration of the PLL circuit. For example, the PLL circuit 15 shown in FIG. 1 can have the configuration shown in FIG. 6A.

Figure 6B:
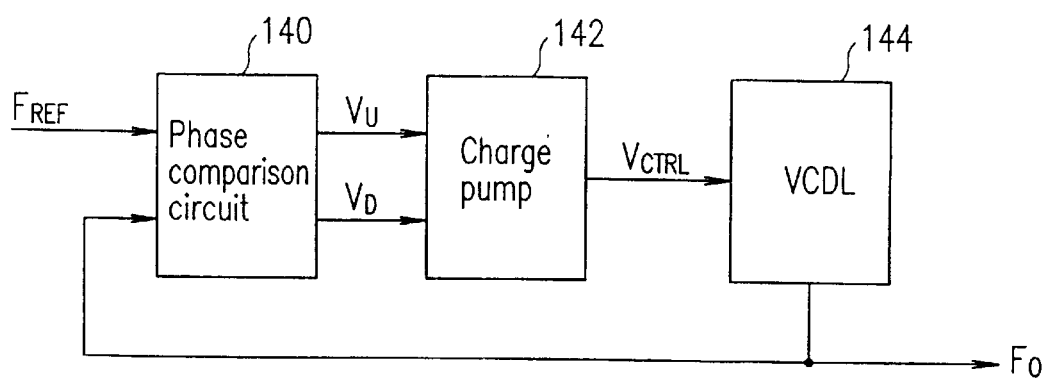
FIG. 6B is a block diagram illustrating a representative configuration of a DLL circuit.

The DLL circuit represented as "DLL" in Table 2 outputs a clock signal synchronized with the reference clock signal by adjusting the delay amount by a delay circuit in accordance with a comparison result between the phase of the reference clock signal and the phase of the clock signal output from the delay circuit. FIG. 6B shows a representative configuration of the DLL circuit. For example, the DLL circuits 6 through 9 shown in FIG. 1 can each have the configuration shown in FIG. 6B.

The mirror delay-type DLL circuit represented as "MD-DLL" in Table 2 is a DLL circuit including a mirror delay-type circuit. FIGS. 4 and 5 show representative configurations of the mirror delay-type DLL circuit. The DLL circuits 6 through 9 can each have the configuration shown in FIG. 4 or 5.

In the above-described example, the combination of a PLL circuit (PLL) used as the first synchronization circuit and a mirror delay-type DLL circuit (MD-DLL) used as the second synchronization circuit (combination 3 in Table 2) is described. The present invention, however, is not limited to such a combination.

For example, in order to achieve an objective of "allowing an internal clock signal synchronized with an external clock signal to be supplied to functional blocks arranged on arbitrary positions on the semiconductor chip", an arbitrary combination (i.e., any of combinations 1 through 6) can be used.

In order to achieve an objective of "operating at a high speed in synchronization with an external clock signal", combination 3, 5 or 6 is preferably usable because use of a mirror delay-type DLL circuit having a relatively short setup time period is suitable for a high-speed operation. Combination 2 or 4 is also usable. These combinations provide a lower operation speed than combinations 3, 5 or 6 but provide a higher operation speed than combination 1.

Combination 6 is optimum for achieving a high-speed operation, but cannot adjust the duty ratio of the clock signal to an appropriate value (e.g., 1:1) since the mirror delay-type DLL circuit does not have a function of adjusting the duty ratio of the clock signal. In consideration of the high-speed operation and the stable supply of a clock signal, combinations 3 and 5 are preferable.

Needless to say, in the case where a synchronization circuit having a short setup time period and a function of adjusting the duty ratio of the clock signal is developed In the future, the combination of such synchronization circuits Is optimum from the viewpoint of the high-speed operation and the stable supply of a clock signal.

As described above, FIG. 6A shows a representative configuration of the PLL circuit. The PLL circuit includes a phase comparison circuit 130, a charge pump 132, and an oscillation circuit (VC0) 134.

The phase comparison circuit 130 compares the phase of a reference clock signal $F_{REF}$ and the phase of a clock signal output from the oscillation circuit 134, and outputs a voltage-up signal $V_V$ or a voltage-down signal $V_D$ to the charge pump 132 in accordance with the comparison result. The charge pump 132 increases a control voltage $V_{CTRL}$ in response to the voltage-up signal $V_U$ and decreases the control voltage $V_{CTRL}$ in response to the voltage-down signal $V_D$. The oscillation circuit 134 changes the frequency of the clock signal in accordance with the control voltage $V_{CTRL}$. Such a feedback control outputs the clock signal $F_O$ synchronized with the reference clock signal $F_{REF}$ from the oscillation circuit 134.

As described above, FIG. 6B shows a representative configuration of a DLL circuit. The DLL circuit includes a phase comparison circuit 140, a charge pump 142, and a delay circuit (VCDL) 144.

The phase comparison circuit 140 compares the phase of the reference clock signal FR and the phase of the clock signal $F_O$ output from the delay circuit 144, and outputs voltage-up signal $V_U$ or the voltage-down signal $V_D$ to the charge pump 142 in accordance with the comparison result. The charge pump 142 increases the control voltage $V_{CTRL}$ in response to the voltage-up signal $V_U$, and decreases the control voltage $V_{CTRL}$ in response to the voltage-down signal $V_D$. The delay circuit 144 changes the delay amount in accordance with the control voltage $V_{CTRL}$. Thus, the delay amount of the clock signal $F_O$ output from the delay circuit 144 with respect to the reference clock signal $F_{REF}$ is changed. Such a feedback control outputs the clock signal $F_O$ synchronized with the reference clock signal $F_{REF}$ from the delay circuit 144.

Figure 7:
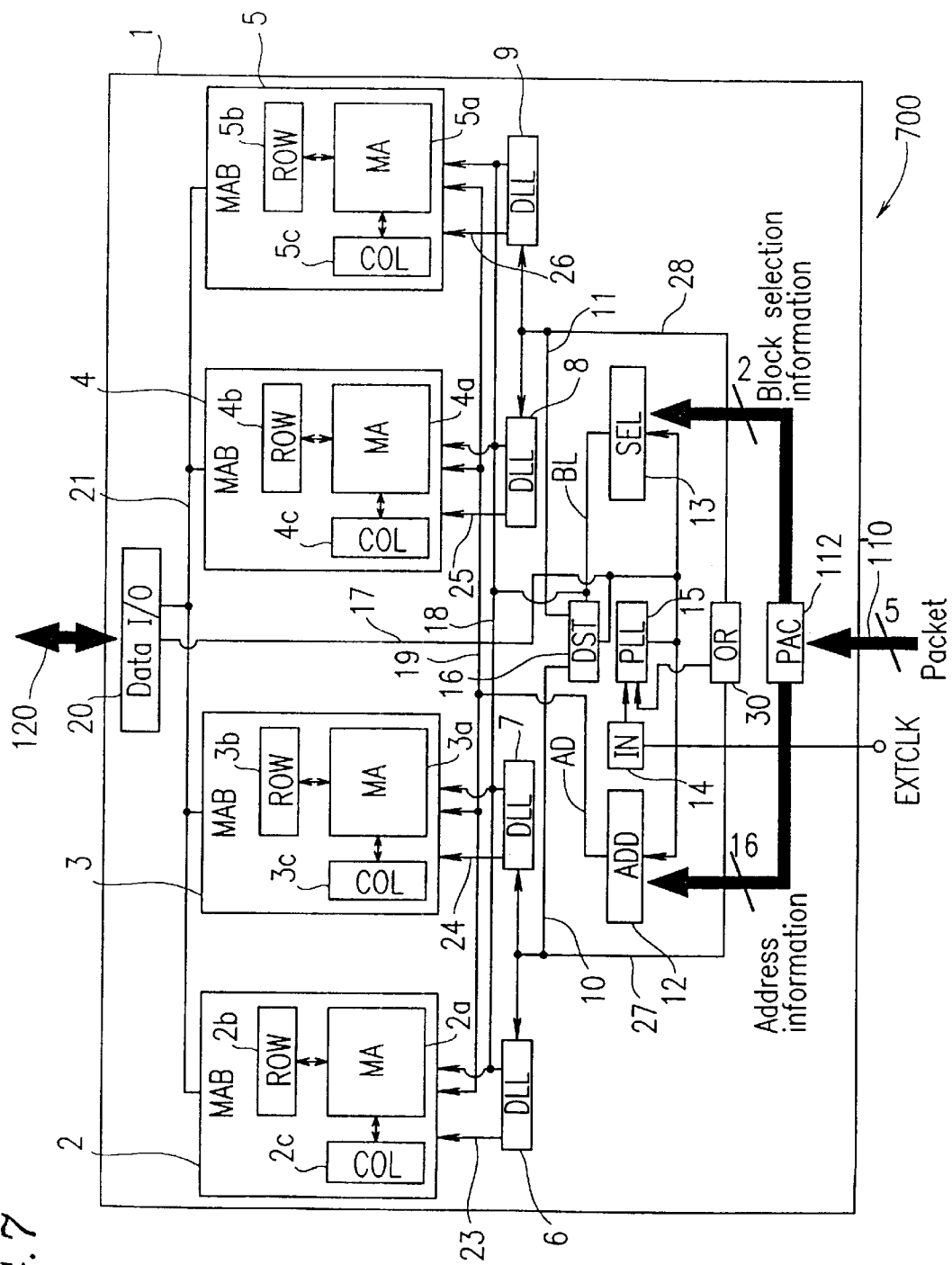
FIG. 7 is a block diagram illustrating an alternative structure of a semiconductor integrated circuit according to the present invention.

FIG. 7 is a block diagram illustrating an alternative structure of the semiconductor integrated circuit according to the present invention. In FIG. 7, the semiconductor integrated circuit is represented by reference numeral 700. In FIG. 7, identical elements as those described with reference to FIG. 1 bear identical reference numeral therewith, and detailed descriptions thereof will be omitted.

As shown in FIG. 7, a clock signal distribution section (DST) 16 is inserted between the PLL circuit 15 and each of the internal clock signal lines 10 and 11. An OR circuit (OR) 30 is inserted between the PLL circuit 15 and each of feedback lines 27 and 28.

The clock signal distribution section 16 outputs the first internal clock signal INTCLK1 to either one of the internal clock signal line 10 or 11 in accordance with the block selection signal BL.

In the case where the memory cell array block 2 and the DLL circuit 6, or the memory cell array block 3 and the DLL circuit 7 are selected by the block selection signal BL, the clock signal distribution section 16 outputs the first internal clock signal INTCLK1 to the internal clock signal line 10 but not to the internal clock signal line 11. Thus, the first internal clock signal INTCLK1 is supplied to the DLL circuits 6 and 7 connected to the internal clock signal line 10.

In the case where the memory cell array block 4 and the DLL circuit 8, or the memory cell array block 5 and the DLL circuit 9 are selected by the block selection signal BL the clock signal distribution section 16 outputs the first internal clock signal INTCLK1 to the internal clock signal line 11 but not to the internal clock signal line 10. Thus, the first internal clock signal INTCLK1 is supplied to the DLL circuits 8 and 9 connected to the internal clock signal line 11.

The first internal clock signal INTCLK1 output to the internal clock signal line 10 a input to the OR circuit via the feedback line 27. The first clock signal INTCLK1 output to the internal clock signal line 11 is input to the OR circuit 30 via the feedback line 28. The OR circuit 30 performs an OR operation to the signal on the feedback line 27 and the signal on the feedback line 28, and outputs a signal indicating the operation result to the PLL circuit 15.

Thus, when the first internal clock signal INTCLK1 is output to the internal clock signal line 10, the first internal clock signal INTCLK1 is feedback to the PLL circuit 15 via the feedback line 27 and the OR circuit 30. When the first Internal clock signal INTCLK1 is output to the internal clock signal line 11, the first internal clock signal INTCLK1 is feedback to the PLL circuit 15 via the feedback line 28 and the OR circuit 30. The first internal clock signal INTCLK1 feedback to the PLL circuit 15 is used for synchronization with the external clock signal EXTCLK.

Figure 8:
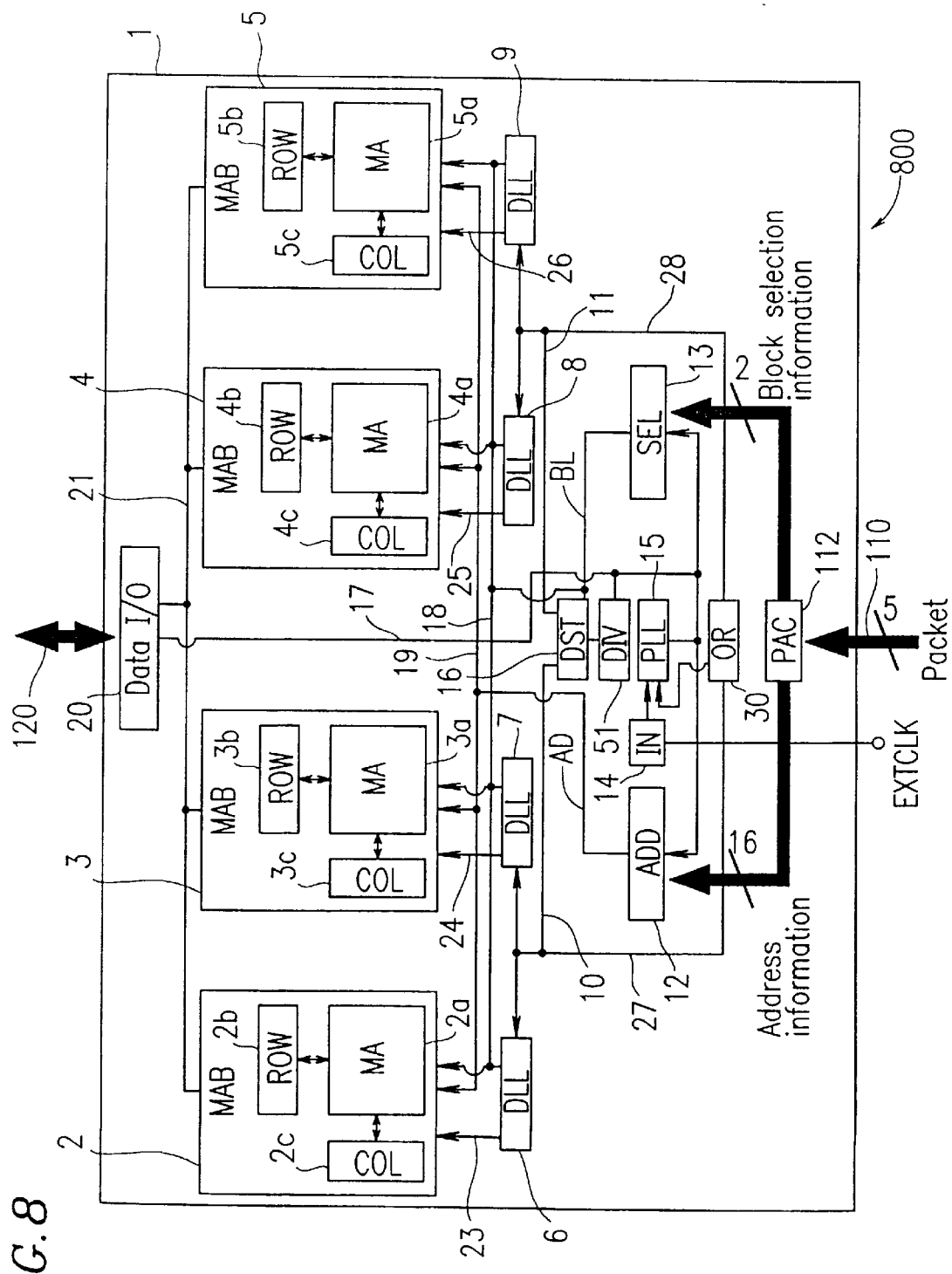
FIG. 8 is a block diagram illustrating an another alternative structure of a semiconductor integrated circuit according to the present invention.

FIG. 8 is a block diagram of another alternative structure of the semiconductor integrated circuit according to the present invention In FIG. 5 the semiconductor integrated circuit is represented by reference numeral 800. In FIG. 8, identical elements as those described with reference to FIG. 7 bear identical reference numeral therewith, and detailed descriptions thereof will be omitted.

As shown in FIG. 8, a frequency division circuit (DIV) 51 is inserted between the PLL circuit 15 and the clock signal distribution section 16.

The frequency division circuit 51 divides the frequency of the first internal clock signal INTCLK1 supplied from the PLL circuit 15 to generate a divisional internal clock signal INTCLK1'. The divisional internal clock signal INTCLK1' is output to either one of the internal clock signal line 10 or 11 by the clock signal distribution section 16.

In a semiconductor chip having a dynamic random access a memory (DRAM) mounted thereon, data read from a memory cell is time-consuming. Accordingly, the frequency of an internal clock signal is usually lower than the frequency of an external clock signal. Therefore, it in especially suitable to the semiconductor chip having a dynamic random access memory (DRAM) mounted thereon to lower the frequency of the first internal clock signal INTCLK1 using the frequency division circuit S1 as shown in FIG. 8.

In the above-described examples, one memory cell array block and one DLL circuit are selected by the block selection signal BL. The present invention, however, is not limited to such a structure. A plurality of memory cell array blocks and a plurality of DLL circuits can be selected by the block selection signal BL.

In the above-described examples, a memory cell array block is used as an exemplary functional block for performing a prescribed function. The present invention, however, is not limited to such a structure. The present invention is applicable to any semiconductor integrated circuit other than memories. The second internal clock signal INTCLK2 can be supplied to any functional block other than a memory cell array block.

According to the present invention, an internal clock signal synchronized with an external clock signal can be supplied to functional blocks arranged on arbitrary positions on the semiconductor chip without generating a skew of the internal clock signal.

According to the present invention, the semiconductor integrated circuit is operable at a high speed in synchronization with an external clock signal.

According to the present invention, the semiconductor integrated circuit is operable at a low power consumption in synchronization with an external clock signal.

Various other modifications will be apparent to and can be readily made by those skilled in the art without departing from the scope and spirit of this invention. Accordingly it is not intended that the scope of the claims appended hereto be limited to the description as set forth herein but rather that the claims be broadly construed.

What is claimed is:

1. A semiconductor integrated circuit provided on a semiconductor chip, comprising:

a first synchronization circuit for receiving an external clock signal supplied from outside the semiconductor chip and outputting a first internal clock signal synchronized with the external clock signal and usable inside the semiconductor chip;

a plurality of second synchronization circuits, each of the plurality of second synchronization circuits receiving the first internal clock signal and outputting a second internal clock signal synchronized with the first internal clock signal and usable inside the semiconductor chip;

a plurality of functional blocks, each of the plurality of functional blocks being operable in synchronization with the second internal clock signal output from a corresponding one of the plurality of second synchronization circuits; and a selection circuit for selecting at least one of the plurality of functional blocks in accordance with a functional block selection signal, wherein the plurality of second synchronization circuits are selectively activated in accordance with the functional block selection signal.

2. A semiconductor integrated circuit according to claim 1, wherein the first synchronization circuit has a first setup time period from when an operation start is requested until the first synchronization circuit starts a synchronization operation, each of the plurality of second synchronization circuits has a second setup time period from when an operation start is requested until the second synchronization circuit starts a synchronization operation, and the second setup time period is shorter than the first setup time period.

3. A semiconductor integrated circuit according to claim 1, wherein the first synchronization circuit has a function of adjusting a duty ratio of the first internal clock signal.

4. A semiconductor integrated circuit according to claim 1, wherein at least one of the plurality of second synchronization circuits is a mirror delay-type DLL circuit including a circuit for advancing a phase of the second internal clock signal.

5. A semiconductor integrated circuit according to claim 1, wherein:

the plurality of functional blocks include memory cell array blocks each including a row-system circuit for receiving a row address and a column-system circuit for receiving a column address, the row-system circuit is operable in response to the functional block selection signal, and the column-system circuit is operable in response to the second internal clock signal.

* * * * *